United States Patent
Yamanashi et al.

(10) Patent No.: US 6,469,261 B2
(45) Date of Patent: Oct. 22, 2002

(54) WIRING UNIT

(75) Inventors: Makoto Yamanashi; Takao Murakami; Hiroyuki Suzuki, all of Shizuoka (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 09/911,830

(22) Filed: Jul. 25, 2001

(65) Prior Publication Data

US 2002/0050391 A1 May 2, 2002

(30) Foreign Application Priority Data

Jul. 27, 2000 (JP) .................................... 2000-226739

(51) Int. Cl.$^7$ ................................................ H05K 1/00
(52) U.S. Cl. .................. 174/268; 174/254; 174/117 F; 361/749
(58) Field of Search .............................. 174/261–268, 174/117 F, 117 FF, 254; 361/749; 439/498; 156/53–55

(56) References Cited

U.S. PATENT DOCUMENTS

| | | | | |
|---|---|---|---|---|
| 3,601,755 A | * | 8/1971 | Shiells | 439/492 |
| 3,997,229 A | * | 12/1976 | Narozny et al. | 439/492 |
| 4,187,606 A | * | 2/1980 | Sinclair | 29/882 |
| 5,162,611 A | * | 11/1992 | Nichols et al. | 174/115 |
| 5,274,195 A | * | 12/1993 | Murphy et al. | 174/117 FF |
| 5,397,864 A | * | 3/1995 | Rai et al. | 174/261 |

* cited by examiner

*Primary Examiner*—Kamand Cuneo
*Assistant Examiner*—Tuan Dinh
(74) *Attorney, Agent, or Firm*—Armstrong, Westerman & Hattori, LLP

(57) ABSTRACT

A wiring unit is provided, by which the cost of the manufacture and assembly thereof can be prevented from raising and the miniaturization thereof can be attained. The wiring unit 1 includes a first flexible insulating sheet 2, a plurality of flexible band-shaped conductors 3 and a plurality of enameled wires 4. The band-shaped conductors 3 are arranged in parallel with each other on the surface 2a of the first insulating sheet 2. Wires 16 are connected to both ends of the band-shaped conductor 3. The enameled wire 4 electrically connects a plurality of the band-shaped conductors 3 with each other. The first insulating sheet 2 is rolled up around an axis P parallel to the band-shaped conductor 3 from one end 5 to the other end 6 of the first insulating sheet 2. The first insulating sheet 2 is rolled up into a roll, thereby the wiring unit 1 is produced.

3 Claims, 3 Drawing Sheets

WIRING UNIT

BACKGROUND OF THE INVENTION (1) Field of the Invention

The present invention relates to a wiring unit received in an electric junction box and the like, which is mounted on a motor vehicle as a mobile unit and the like.

(2) Description of the Related Art

In a motor vehicle as a mobile unit, there is generally mounted various electronic equipment, such as lamps, for example headlamps and tail lamps, and motors, for example a starter motor and a motor for an air-conditioner.

In order to supply electric power to the various electronic equipment, junction blocks are arranged at desired positions in the motor vehicle. In the junction block, circuit boards including printed boards, busbars, and the like, are laminated and various electric circuit units, such as many fuses and relays, are integrated into the circuit boards.

Since the junction block may include fuses, relays and busbars, the junction block is called a fuse block, relay box or electric junction box as a generic term. In this specification, the fuse block, relay box and junction block are hereinafter called, the "electric junction box", as a generic term.

The electric junction box has a case, control panels received in the case and so on. Electric components, such as relays, fuses and connectors, are mounted in the case. A plurality of electric wires connected to the various electronic equipment are guided into the case. When the control panel is received in the case, wires connected to the various electronic equipment and terminals of the various electric components are electrically connected according to a predetermined pattern.

In order to facilitate the connections between the electric wires and the terminals of electric components, for example, a wiring unit 54 shown in FIG. 5 has been proposed as the control panel. The wiring unit 54 has a plurality of boards 61 to be laminated with each other, a plurality of terminals 62 and connecting bars 63.

Each board 61 is made of an electrically insulating material and formed in a flat rectangular plate. Each board 61 has a plurality of hollow grooves 64, hollow portions 65 and through holes 66. Each hollow groove 64 is formed hollow from the surface of the board 61. The grooves 64 are formed in parallel with each other, and extend in the length direction of the board 61.

Each hollow portion 65 is formed hollow from the surface of the board 61 and opens to the hollow groove 64. The hollow portions 65 are formed in parallel with each other along the length direction of the corresponding hollow groove 64. Each hollow portion 65 is formed rectangular in a plan view thereof.

Each through hole 66 penetrates through a bottom position of the corresponding hollow portion 65 of the board 61. The through hole 66 is provided at a position where the through holes 66 face and align with each other when the boards 61 are laminated with each other.

Each terminal 62 is made of an electrically conductive material such as a sheet metal. As shown in FIG. 6, the terminal 62 consists of an electrically contacting part 67 and a connecting part 68 to a wire. The connecting bar 63 can be inserted into the electrically contacting part 67. When the connecting bar 63 is inserted into the electrically contacting part 67, an elastic restoring force arises for preventing the connecting bar 63 from being inserted. That is, when the connecting bar 63 is inserted into the electrically contacting part 67, a relative positional relationship between the electrically contacting part 67 and the connecting bar 63 is kept constant by the elastic restoring force.

A wire 69 can be wired along a direction in the connecting part 68 to the wire 69. The connecting part 68 has a pressure welding part 70, which can be pressure welded to the wire 69, and a pair of wire holding parts 71 provided at positions where a pair of the wire holding parts 71 put the pressure welding part 70 therebetween in the wiring direction of the wire 69.

The pressure welding part 70 has two pairs of press-in blades 72, which cut into a covering portion of the wire 69 between the two pairs thereof so as to come into contact with a core of the wire 69. The wire holding parts 71 have a pair of caulking pieces 73 for caulking the wire 69 therebetween together with the covering portion of the wire 69. The caulking pieces 73 hold the wire 69 therebetween so as to keep the connection between the press-in blades 72 of the pressure welding part 70 and the core of the wire 69.

The electrically contacting part 67 and the connecting part 68 are disposed to have such a relative positional relationship that the wiring of the wire 69 is not disturbed in the connecting part 68. Specifically, with respect to the wiring direction of the wire 69, the electrically contacting part 67 is disposed intersecting at right angles with respect to the connecting part 68 as shown FIG. 6.

The terminal 62 electrically connects the wire 69, which is pressure welded to the pressure welding part 70, namely the connecting part 68, to the connecting bar 63 received into the electrically contacting part 67. The terminal 62 is mounted on the board 61 in a state that the electrically contacting part 67 is received in the hollow portion 65 and the connecting part 68 is received in the hollow groove 64.

The connecting bar 63 is made of an electrically conductive material and is formed in a band plate-shape. When the connecting bar 63 is received into the through hole 66 and into the electrically contacting part 67 of the terminal 62, the connecting bar 63 electrically connects with the wire 69.

In the wiring unit 54, the wires 69 connected to the various electronic equipment are wired into the hollow grooves 64. A plurality of the boards 61 are laminated therein, and the hollow portions 65 that receive the electrically contacting part 67 of the terminal 62 and the through holes 66 for receiving the connecting bar 63, and the like, are selected as desired, thereby the wires 69 are electrically connected to the electric components, such as relays, fuses and collectors, according to a predetermined pattern.

As for the wiring unit 54 shown in FIG. 5, in order to form the hollow grooves 64, hollow portions 65, and the like, on each board 61, relatively complicated hollows and projections must be formed on the surface of the board 61. Therefore, a mold having a complicated configuration for molding the board 61 is required, causing a high cost thereof.

The terminal 62 is formed by bending a sheet metal. Since there are many portions of the sheet metal, at which the sheet metal should be bent, the man-hours required to manufacture the terminal 62 increases, causing a high cost of the manufacture.

Moreover, upon the assembly of the wiring unit 54, the wire 69 must be pressure welded after the terminals 62 are mounted on each board 61, from board 61 to board 61. Therefore, the man-hours required to assemble the wiring unit 54 increases, causing a high cost of the manufacture.

Furthermore, the wiring unit 54 consists of the wires 69 and terminals 62, which are arranged along the hollow grooves 64, and the connecting bars 63, which are received in the electrically contacting part 67. Thus, since the circuit constitution of the wiring unit 54 is formed with the wires 69 and terminals 62, which are overlapped with each other along a direction of the lamination of the boards 61, a restriction on circuit designing increases and the wiring unit 54 shows a tendency to have large size.

SUMMARY OF THE INVENTION

It is therefore an objective of the present invention to provide a wiring unit, by which the cost of the manufacture and assembly thereof can be prevented from rising and the miniaturization thereof can be attained.

In order to attain the above objective, the present invention is to provide a wiring unit comprising: a first flexible insulating sheet; flexible band-shaped conductors, a plurality of which are arranged in parallel with each other on said first insulating sheet, and a wire being connected to each end of said band-shaped conductor; and flexible conductor wires connected to at least two said band-shaped conductors out of plurality of said band-shaped conductors, wherein said first insulating sheet is rolled up into a roll in a manner that plurality of said band-shaped conductors are situated inside in said roll.

According to the wiring unit described above, a simple wiring unit, having a first flexible insulating sheet, a plurality of band-shaped conductors arranged in parallel with each other on the surface of said first insulating sheet, and conductor wires connected to said band-shaped conductors, can be obtained. Therefore, the man-hours required to manufacture the components, which constitute the wiring unit, and to assemble the wiring unit can be reduced, thereby the cost thereof can be reduced. Furthermore, since said first insulating sheet is rolled up into a roll, a small size-wiring unit can be obtained.

Preferably, said first insulating sheet is rolled up around an axis parallel to said band-shaped conductors arranged in parallel with each other.

According to the wiring unit described above, since said first insulating sheet is rolled up around an axis parallel to said band-shaped conductors, the wires connected to both ends of said band-shaped conductors securely protrude from the edge of said first insulating sheet rolled up into a roll. Therefore, the wires can be securely connected to the various electronic equipment and the various electric components, such as fuses and relays. Therefore, the wiring unit can be securely connected to the outside equipment, such as the electronic equipment and the electric components.

Preferably, the wiring unit further comprises second flexible insulating sheets stuck on said first insulating sheet, wherein each said conductor wire is held between said second insulating sheet and a cooperating surface of said first insulating sheet.

According to the wiring unit described above, since each conductor wire is held between said second insulating sheet stuck on said first insulating sheet in cooperation with said first insulating sheet, the electrical connection between said conductor wire and said band-shaped conductor is securely prevented from being cut at a time, for example, when said first flexible insulating sheet is rolled up. Therefore, the wires connected to both ends of said band-shaped conductor can be electrically connected with respect to each other or electrically insulated with each other according to a predetermined pattern.

DESCRIPTION OF THE PREFERRED EMBODIMENTS

In the following, a wiring unit according to a first preferred embodiment of the present invention will be explained with reference to FIGS. 1 and 2. A wiring unit 1 as shown in FIG. 1 is received in a case of an electric junction box, which is mounted on a mobile unit such as a motor vehicle, and connects various electronic equipment and a power supply arranged in the motor vehicle to electric components, such as relays and fuses, in the electric junction box according to a predetermined pattern.

Figure 1:
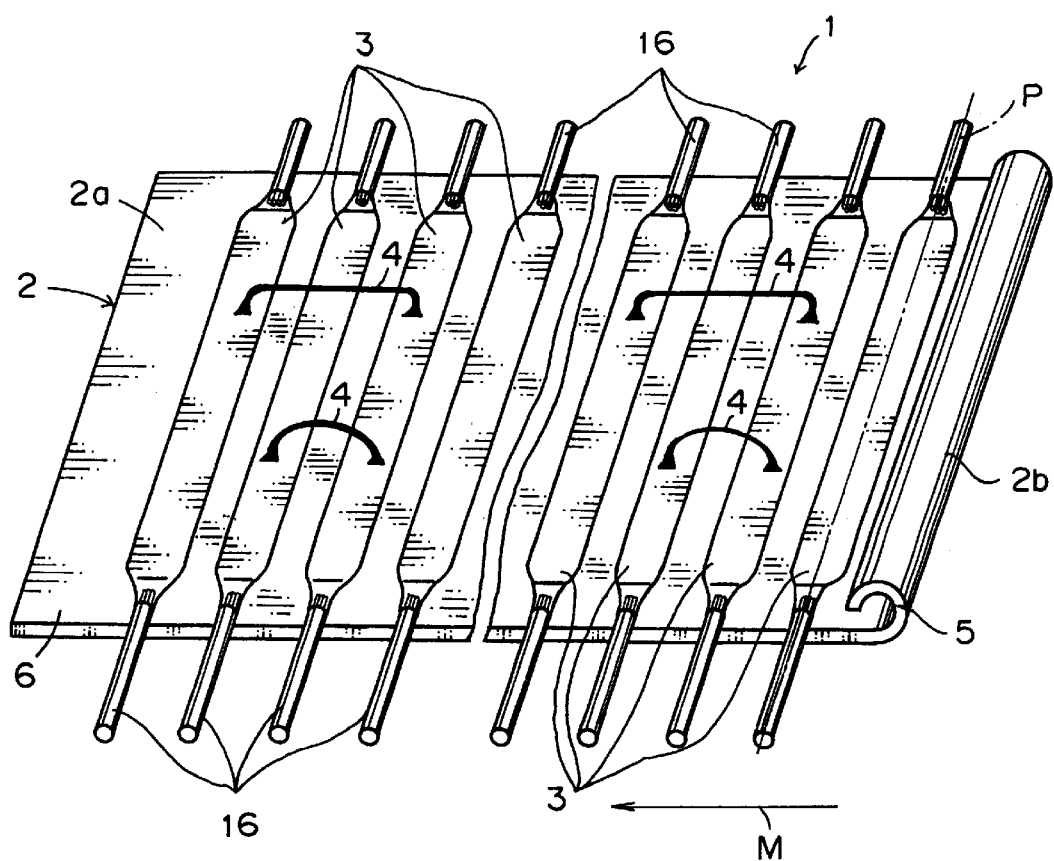
FIG. 1 is a perspective view illustrating a constitution of a wiring unit according to a first preferred embodiment of the present invention.

As shown in FIG. 1, the wiring unit 1 comprises a flexible insulating sheet 2 (corresponding to a first flexible insulating sheet in the claims), a plurality of flexible band-shaped conductors 3 and a plurality of enameled wires 4. The insulating sheet 2 is made of an insulating synthetic resin and formed in a sheet-shape.

The band-shaped conductor 3 is made of electrically conductive metal and formed relatively thin in a band plate-shape. The band-shaped conductors 3 are arranged on the surface 2a of the insulating sheet 2 in a manner that the length direction of the band-shaped conductor 3 is parallel to the width direction of the insulating sheet 2. The band-shaped conductors 3 are arranged in parallel with each other leaving the same space therebetween on the surface 2a along the length direction of the insulating sheet 2.

To both ends of each band-shaped conductor 3, a core of the wire 16 is connected by means of, for example, melt welding, pressure welding or brazing with solder. The wires 16 are electrically connected to various electronic equipment, a power supply and electric components such as relays and fuses.

The enameled wire 4 is a known one, which is formed by baking plural times an insulating coating onto the surface of a copper wire, and is flexible. The enameled wire 4 is connected to each end of the band-shaped conductor 3 by means of, for example, melt welding, pressure welding or brazing with solder. The enameled wire 4 electrically connects a plurality of the band-shaped conductors 3 with each other. In FIG. 1, as an example, the enameled wire 4 electrically connects a pair of the band-shaped conductors 3 with each other.

The wiring unit 1 described above is produced through the following steps. The band-shaped conductors 3 are arranged on the surface 2a of the insulating sheet 2 in parallel with each other leaving about the same space therebetween along the length direction of the insulating sheet 2, in a manner that the length direction of the band-shaped conductors 3 is parallel to the width direction of the insulating sheet 2. The band-shaped conductors 3 are fixed on the surface 2a of the insulating sheet 2. To both ends of each band-shaped conductor 3, an electric wire 16 is connected.

Both ends of the enameled wire 4 are connected to the desired band-shaped conductors 3 so as to electrically connect the band-shaped conductors 3, which should be electrically connected with each other. Then, the insulating sheet 2 is rolled up around the axis P, which is parallel to the length direction of the band-shaped conductor 3, from one end 5 to another end 6 of the insulating sheet 2, along an arrow M in FIG. 1, which is parallel to the length direction of the insulating sheet 2. At this time, the insulating sheet 2 is rolled up into a roll in a manner that the band-shaped conductors 3 are situated inside in the roll.

Figure 2:
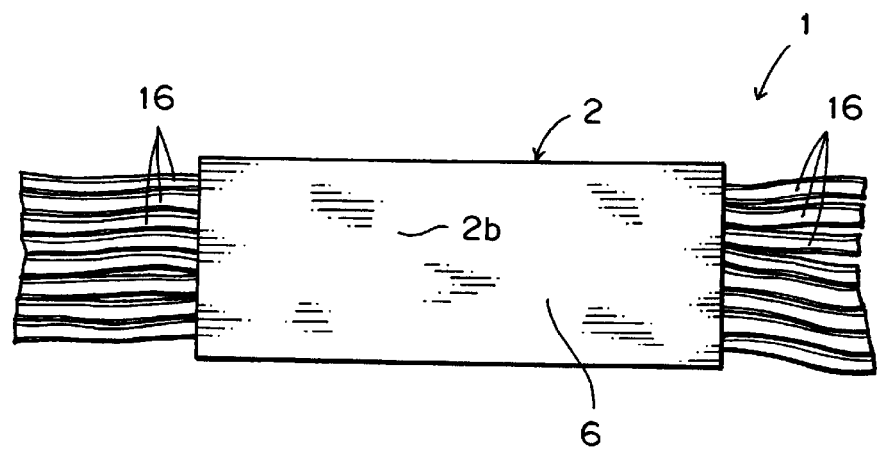
FIG. 2 is a side view illustrating a state, in which the wiring unit according to the first preferred embodiment is completed.

As shown in FIG. 2, after the insulating sheet 2 is rolled up into a roll, an adhesive tape or adhesive is coated on said another end 6 of the insulating sheet 2, thereby said another end 6 is fixed on a surface 2b, which is situated at the back of the surface 2a of the insulating sheet 2, and thus the insulating sheet 2 is kept in a roll-shape, thereby the wiring unit 1 is completed.

According to the first preferred embodiment, a simple wiring unit, having the insulating sheet 2, a plurality of the band-shaped conductors 3 arranged in parallel with each other on the surface 2a of the insulating sheet 2, and the enameled wires 4 connected to the band-shaped conductors 3, can be obtained. Therefore, the man-hours required to manufacture the components, which constitute the wiring unit, and to assemble the wiring unit can be reduced, thereby the cost thereof can be reduced. Furthermore, since the insulating sheet 2 is rolled up into a roll, a small size-wiring unit 1 can be obtained.

Since the insulating sheet 2 is rolled up around the axis P, as shown in FIG. 2, the wires 16 connected to both ends of the band-shaped conductors 3 securely protrude from the edge of the insulating sheet 2, which is rolled up into a roll. Therefore, the wires 16 can be securely connected to the various electronic equipment and the various electric components, such as fuses and relays.

Therefore, by using the wiring unit 1, the outside equipment such as the electronic equipment, can be securely connected to the electric components, and the like, according to a desired pattern, thereby a use of connectors, such as joint connectors, are not needed any more.

In the following, a wiring unit according to a second preferred embodiment of the present invention will be explained with reference to FIGS. 3 and 4. The same reference numerals are used hereinafter with respect to the same constitutional elements with the first preferred embodiment.

Figure 3:
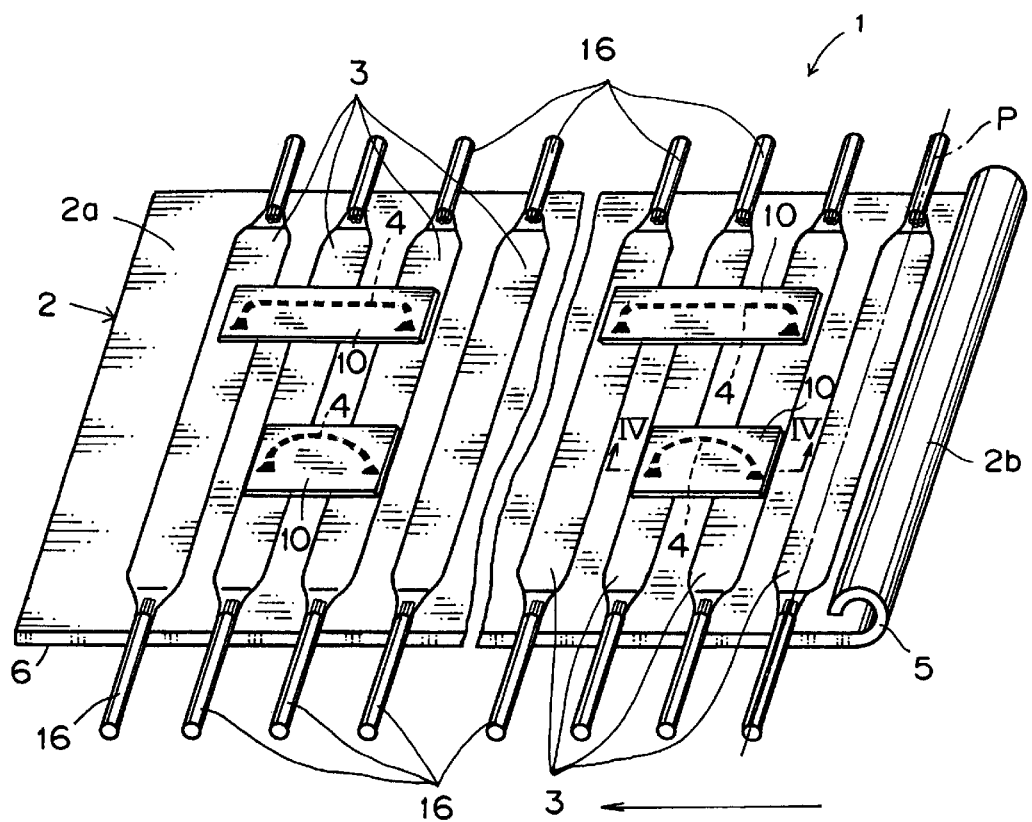
FIG. 3 is a perspective view illustrating a constitution of a wiring unit according to a second preferred embodiment of the present invention.
Figure 4:
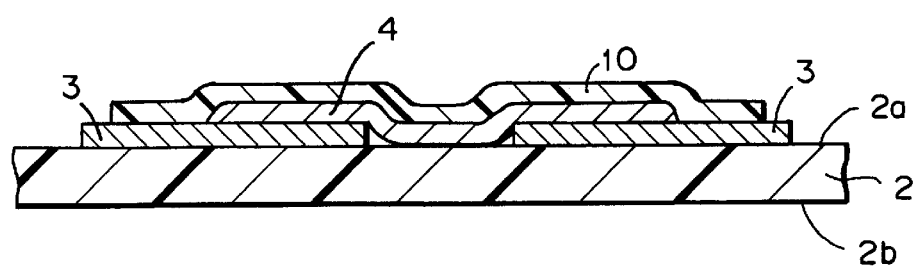
FIG. 4 is a cross sectional view along the IV—IV line in FIG. 3.
Figure 5:
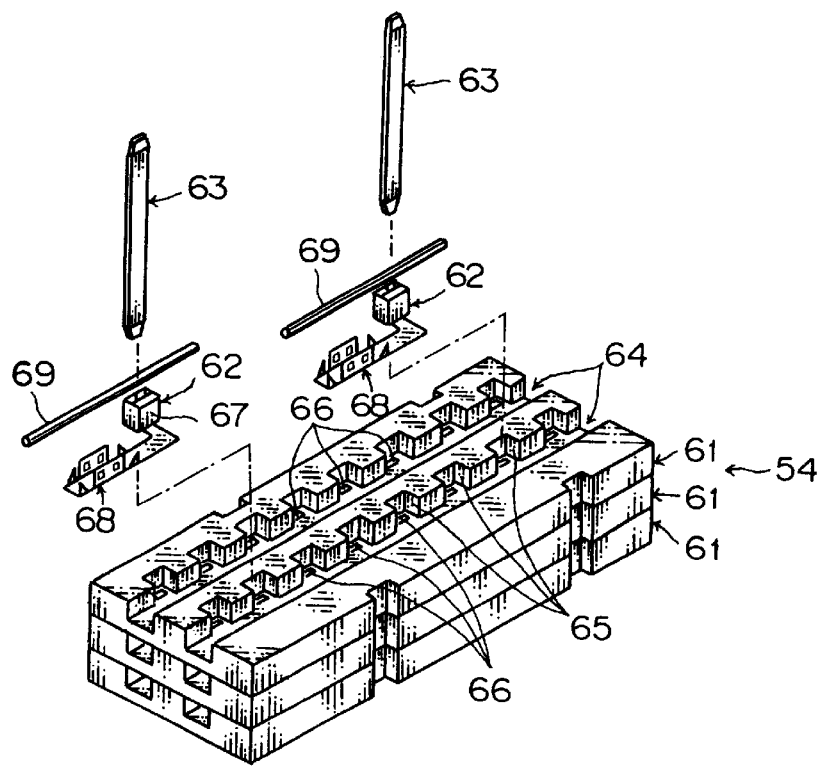
FIG. 5 is a perspective view illustrating a conventional wiring unit.
Figure 6:
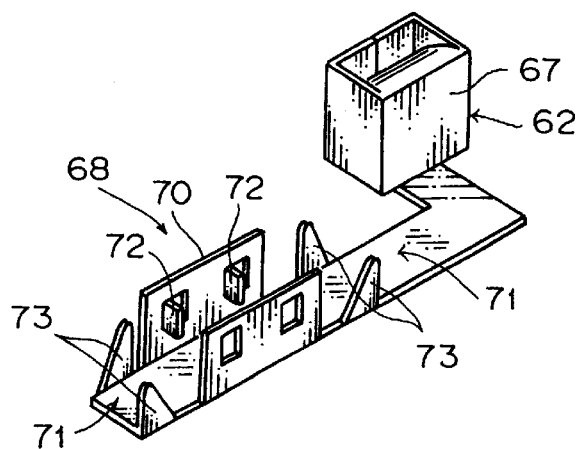
FIG. 6 is a perspective view illustrating a terminal of the conventional wiring unit shown in FIG. 5.

In a wiring unit 1 according to the second preferred embodiment, as shown in FIGS. 3 and 4, additional insulating sheets 10 (corresponding to second flexible insulating sheets in the claim), which are flexible and electrically insulative, are stuck on the surface 2a of the insulating sheet 2. The insulating sheet 10 is formed in a band-shape and stuck on the surface 2a of the insulating sheet 2 in a manner that the enameled wire 4 is held between the insulating sheet 10 and the insulating sheet 2. The insulating sheet 10 itself may be formed with an adhesive tape or may be stuck on the surface 2a by being coated with an adhesive thereon.

According to the second preferred embodiment, similarly to the first preferred embodiment, the wiring unit 1 can be obtained with the simple constitution, therefore the cost of the manufacture and assembly thereof can be prevented from rising and the miniaturization thereof can be attained. Moreover, by using the wiring unit 1, the outside equipment, such as the electronic equipment, can be securely connected to the electric components, and the like, according to a desired pattern.

Since the enameled wire 4 is held between the insulating sheet 10, which is stuck on the insulating sheet 2, and the insulating sheet 2, the electrical connection between the enameled wire 4 and the band-shaped conductor 3 is securely prevented from being severed at a time, for example, when the flexible insulating sheet 2 is rolled up.

In the first and second preferred embodiments of the present invention, the flexible insulating sheet 2 and the band-shaped conductors 3 are employed. Instead, however, a known flexible printed circuit (FPC) or flexible flat cable (FFC), which includes a plurality of band-shaped conductors and insulating layers, may also be employed.

The aforementioned preferred embodiments are described to aid in understanding the present invention and variations may be made by one skilled in the art without departing from the spirit and scope of the present invention.

What is claimed is:

1. A wiring unit comprising:

an elongated first flexible insulating sheet having oppositely spaced ends;

a plurality of flexible band-shaped conductors arranged in parallel with each other on said first insulating sheet, and a wire being connected to each end of said band-shaped conductors; and flexible conductor wires connected between at least two of said band-shaped conductors, said first insulating sheet being rolled from one longitudinal end to the other end into a roll and having its ends mutually secured in a manner that said plurality of said band-shaped conductors are situated inside said roll.

2. A wiring unit according to claim 1, wherein said first insulating sheet is rolled about an axis extending parallel to said band-shaped conductors.

3. The wiring unit according to claim 1 or claim 2, further comprising second flexible insulating sheets covering said conductor wires being stuck to said wiring unit, wherein each said conductor wire is held between said second insulating sheet and a cooperating surface of said first insulating sheet.

* * * * *